(12) United States Patent
Furukawa et al.

(10) Patent No.: US 7,737,504 B2
(45) Date of Patent: Jun. 15, 2010

(54) WELL ISOLATION TRENCHES (WIT) FOR CMOS DEVICES

(75) Inventors: Toshiharu Furukawa, Essex Junction, VT (US); Mark Charles Hakey, Fairfax, VT (US); David Vaclav Horak, Essex Junction, VT (US); Charles William Koburger, III, Delmar, NY (US); Jack Allan Mandelman, Flat Rock, NC (US); William Robert Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 257 days.

(21) Appl. No.: 11/759,981

(22) Filed: Jun. 8, 2007

(65) Prior Publication Data

US 2007/0241408 A1 Oct. 18, 2007

Related U.S. Application Data

(62) Division of application No. 11/279,962, filed on Apr. 17, 2006, now Pat. No. 7,268,028.

(51) Int. Cl.
*H01L 29/772* (2006.01)
(52) U.S. Cl. ............... 257/374; 257/371; 257/E21.545; 257/E29.021
(58) Field of Classification Search ............ 257/506, 257/507, E29.021, E21.545, 371, 374
See application file for complete search history.

(56) References Cited

U.S. PATENT DOCUMENTS

| | | | |
|---|---|---|---|
| 5,536,675 A | 7/1996 | Bohr | |
| 5,675,176 A * | 10/1997 | Ushiku et al. | ............... 257/617 |
| 5,814,547 A | 9/1998 | Chang | |
| 6,137,152 A | 10/2000 | Wu | |
| 6,297,127 B1 | 10/2001 | Chen et al. | |
| 6,307,805 B1 * | 10/2001 | Andersen et al. | ........ 365/230.06 |
| 6,320,233 B1 | 11/2001 | Yamaguchi et al. | |
| 6,509,615 B2 | 1/2003 | Iwata et al. | |
| 6,583,060 B2 * | 6/2003 | Trivedi | ........................ 438/700 |
| 6,875,697 B2 | 4/2005 | Trivedi | |
| 6,956,266 B1 | 10/2005 | Voldman et al. | |
| 2002/0158309 A1 | 10/2002 | Swanson et al. | |
| 2003/0107103 A1 * | 6/2003 | Iwata et al. | .................. 257/506 |
| 2003/0213995 A1 | 11/2003 | Duvvury et al. | |

(Continued)

FOREIGN PATENT DOCUMENTS

JP 11-195702 A 7/1999

*Primary Examiner*—Jerome Jackson, Jr.
*Assistant Examiner*—Paul A Budd
(74) *Attorney, Agent, or Firm*—Schmeiser, Olsen & Watts; Riyon W. Harding

(57) ABSTRACT

A well isolation trenches for a CMOS device and the method for forming the same. The CMOS device includes (a) a semiconductor substrate, (b) a P well and an N well in the semiconductor substrate, (c) a well isolation region sandwiched between and in direct physical contact with the P well and the N well. The P well comprises a first shallow trench isolation (STI) region, and the N well comprises a second STI region. A bottom surface of the well isolation region is at a lower level than bottom surfaces of the first and second STI regions. When going from top to bottom of the well isolation region, an area of a horizontal cross section of the well isolation region is an essentially continuous function.

12 Claims, 12 Drawing Sheets

[Cross section view]

U.S. PATENT DOCUMENTS

2004/0108566 A1   6/2004   Himi et al.
2005/0064678 A1   3/2005   Dudek et al.
2005/0106800 A1   5/2005   Haensch et al.
2007/0040235 A1 *  2/2007   Chan et al. .................. 257/510
2008/0242016 A1 * 10/2008   Cannon et al. .............. 438/224

* cited by examiner

[Top view]

[Cross section view]

[Top view]

[Cross section view]

[Top view]

[Cross section view]

[Top view]

[Cross section view]

[Top view]

[Cross section view]

[Top view]

[Cross section view]

[Top view]

[Cross section view]

[Top view]

[Cross section view]

[Top view]

[Cross section view]

[Top view]

[Cross section view]

[Top view]

[Cross section view]

[Top view]

[Cross section view]

WELL ISOLATION TRENCHES (WIT) FOR CMOS DEVICES

This application is a divisional of Ser. No. 11/279,962, filed Apr. 17, 2006.

BACKGROUND OF THE INVENTION

1. Technical Field

The present invention relates to well isolation trenches (WIT), and more particularly, to well isolation trenches for CMOS (Complementary Metal Oxide Semiconductor) devices (for example SRAM—Static Random Access Memory).

2. Related Art

In a conventional CMOS device including an N channel and a P channel transistor, the N channel transistor is formed on a P well, and the P channel is formed on an N well. There is always a need for a well isolation trench structure (and a method for forming the same) that provides improved electrical properties of the CMOS device.

SUMMARY OF THE INVENTION

The present invention provides a semiconductor fabrication method, comprising providing a semiconductor structure which includes: (a) a semiconductor substrate, and (b) a patterned hard mask layer on top of the semiconductor substrate; etching the semiconductor substrate using the patterned hard mask layer as a mask, resulting in a well isolation trench, a first shallow trench, and a second shallow trench; after said etching the semiconductor substrate is performed, covering the first and second shallow trenches without covering the well isolation trench; and after said covering the first and second shallow trenches is performed, etching the semiconductor substrate through the well isolation trench, resulting in the well isolation trench becoming deeper such that when going from top to bottom of the well isolation region, an area of a horizontal cross section of the well isolation region is an essentially continuous function.

The present invention provides a semiconductor structure, comprising (a) a semiconductor substrate; (b) a P well and an N well in the semiconductor substrate, wherein the P well comprises a first shallow trench isolation (STI) region, and wherein the N well comprises a second STI region; and (c) a well isolation region sandwiched between and in direct physical contact with the P well and the N well, wherein a bottom surface of the well isolation region is at a lower level than bottom surfaces of the first and second STI regions, and wherein when going from top to bottom of the well isolation region, an area of a horizontal cross section of the well isolation region is an essentially continuous function.

The present invention provides a well isolation trench (and a method for forming the same) that provides improved electrical properties of the CMOS device.

BRIEF DESCRIPTION OF THE DRAWINGS

FIGS. 1A-12A show top views of a semiconductor structure 100 going through a fabrication process, in accordance with embodiments of the present invention.

FIGS. 1B-12B show cross section views of the semiconductor structure 100 of FIGS. 1A-12A, respectively, in accordance with embodiments of the present invention.

DETAILED DESCRIPTION OF THE INVENTION

FIGS. 1A-12A show top views of a semiconductor structure 100 going through a fabrication process, in accordance with embodiments of the present invention. FIGS. 1B-12B show cross section views of the semiconductor structure 100 of FIGS. 1A-12A, respectively, in accordance with embodiments of the present invention.

Figure 1A:
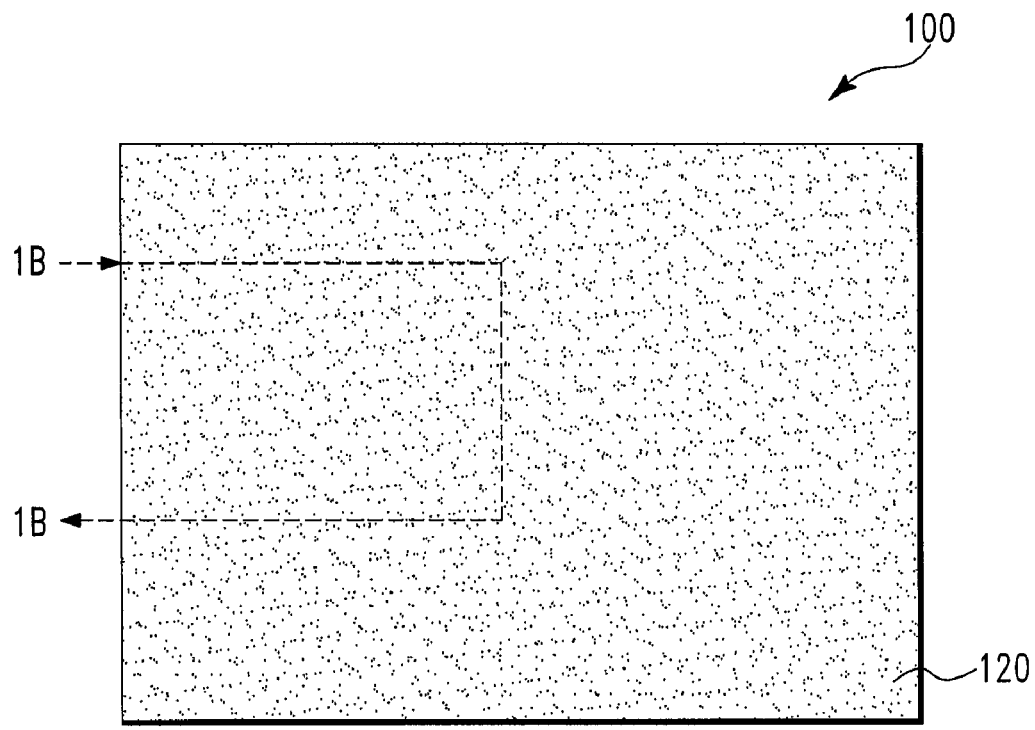
Figure 1B:
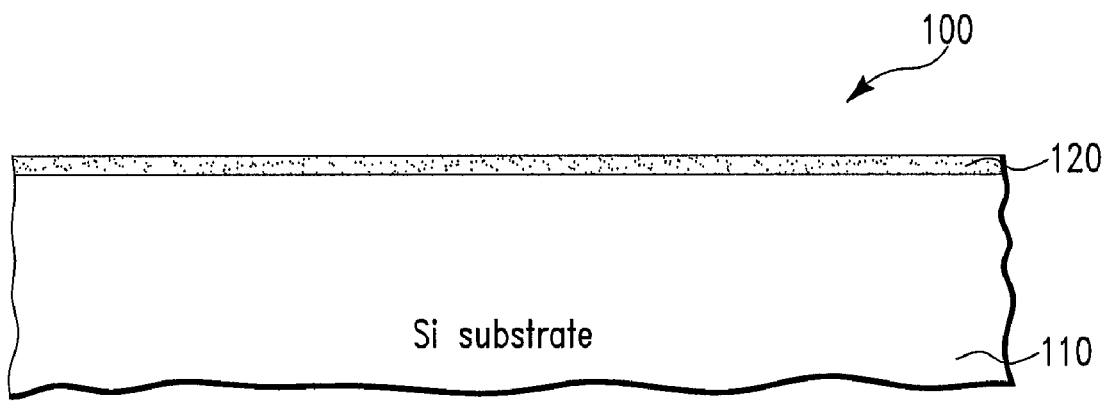

More specifically, with reference to FIG. 1A and FIG. 1B (a cross section view of FIG. 1A along a line 1B-1B), in one embodiment, the fabrication process starts out with a semiconductor substrate 110 (such as silicon substrate). Next, in one embodiment, a pad oxide layer 120 is formed on top of the semiconductor substrate 110 by, illustratively, thermal oxidation. Alternatively, the pad oxide layer 120 can be formed by using a deposition technique such as CVD (Chemical Vapor Deposition) method.

Figure 2A:
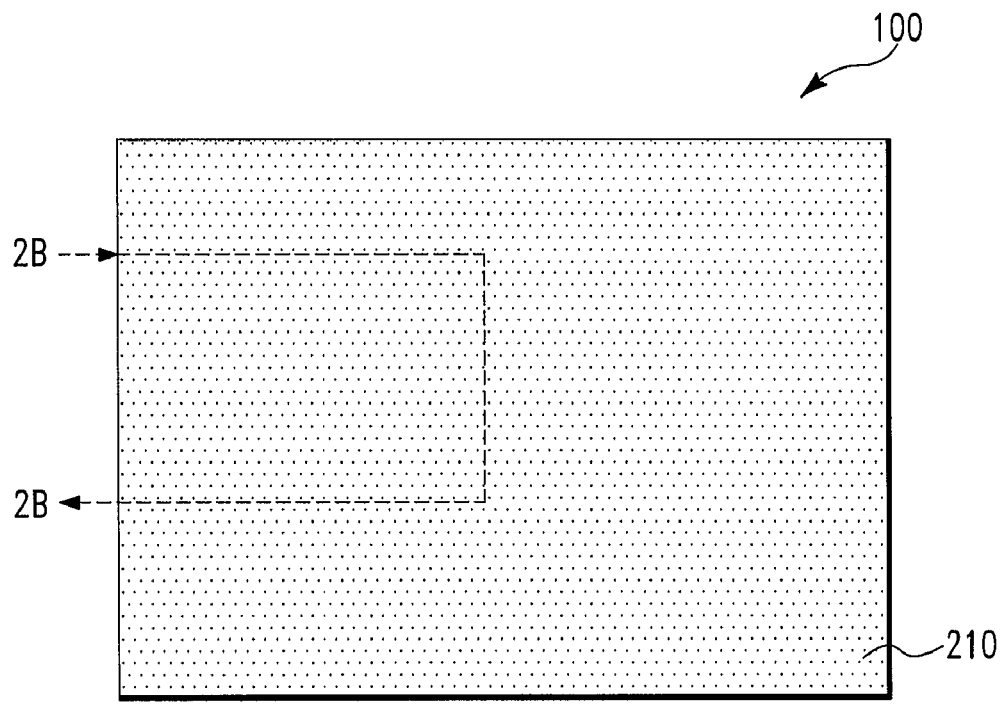
Figure 2B:
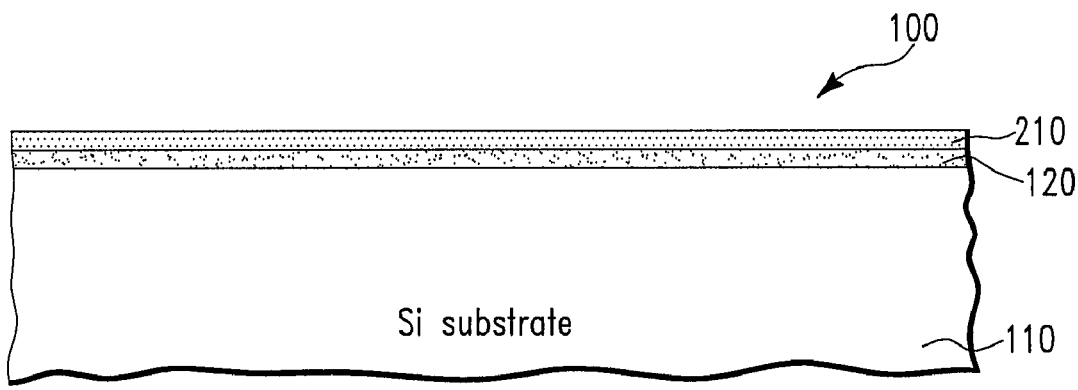

Next, with reference to FIG. 2A and FIG. 2B (a cross section view of FIG. 2A along a line 2B-2B), in one embodiment, a pad nitride layer 210 is formed on top of the structure 100 of FIG. 1A using CVD method. Illustratively, the pad nitride layer 210 comprises silicon nitride.

Figure 3A:
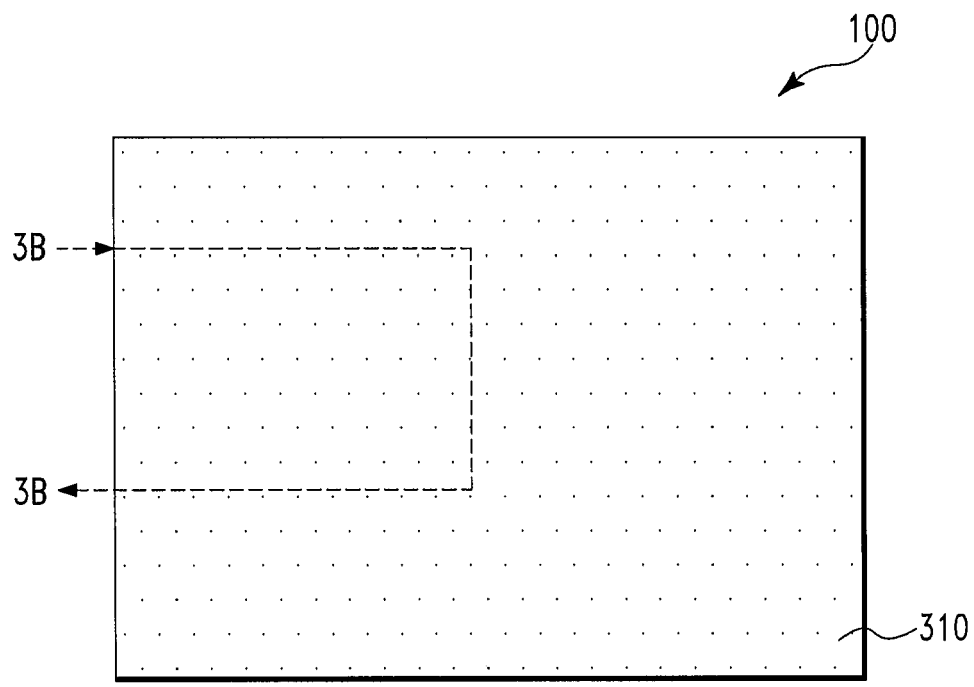
Figure 3B:
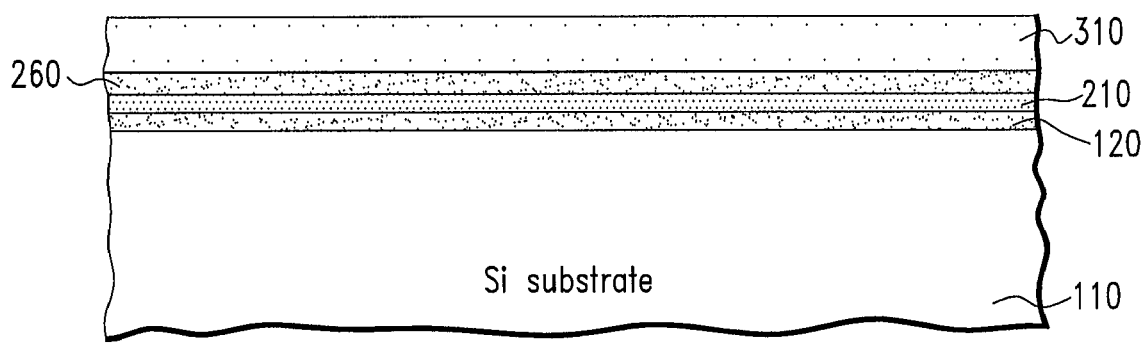

Next, with reference to FIG. 3A and FIG. 3B (a cross section view of FIG. 3A along a line 3B-3B), in one embodiment, a hard mask layer 260 is deposited on top of the structure 100 of FIG. 2A using CVD method. Illustratively, the hard mask layer 260 comprises silicon dioxide or any other suitable material.

Next, in one embodiment, a first photo resist layer 310 is formed on top of the hard mask layer 260 using a conventional method.

Figure 4A:
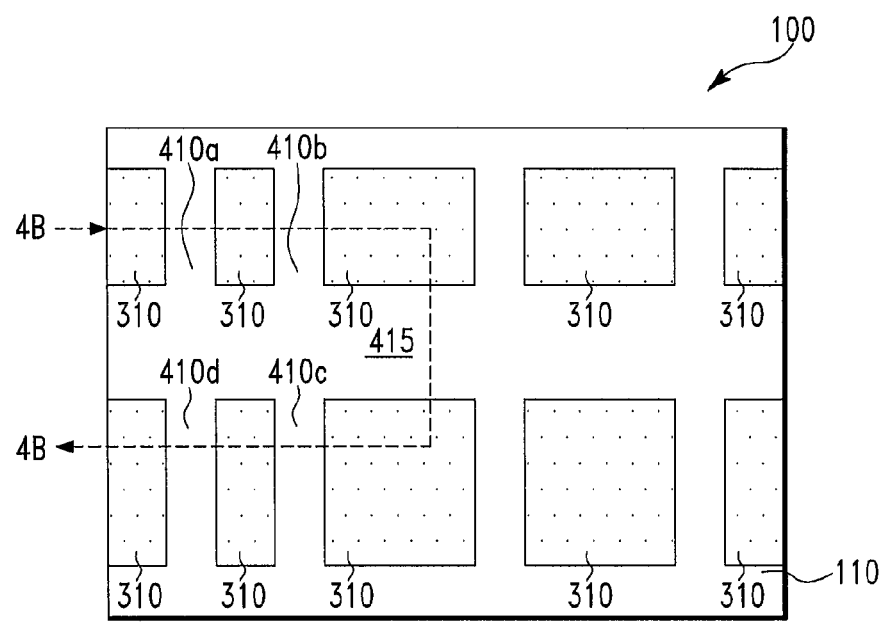
Figure 4B:
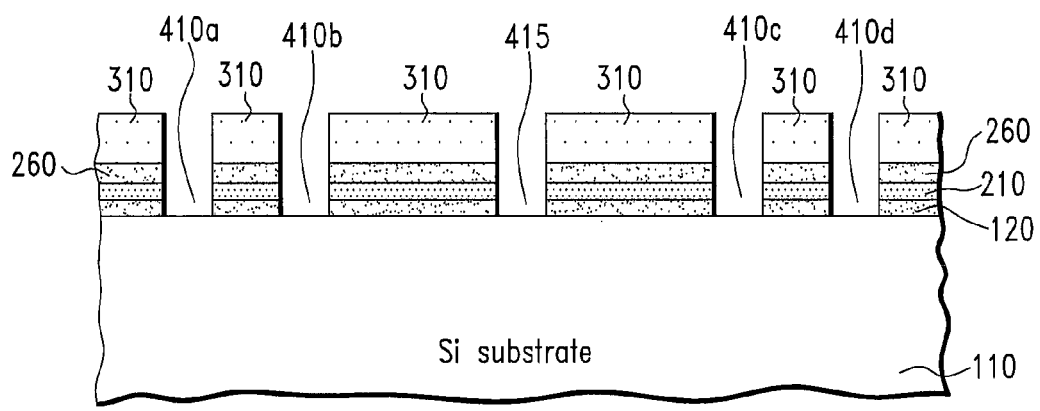

Next, in one embodiment, the first photo resist layer 310 is patterned using a conventional lithography process resulting in a first patterned photo resist layer 310 as shown in FIG. 4A and FIG. 4B (a cross section view of FIG. 4A along a line 4B-4B).

Next, in one embodiment, the pattern of the first patterned photo resist layer 310 is transferred in turn to the hard mask layer 260, the pad nitride layer 210, and the pad oxide layer 120, resulting in the structure 100 of FIG. 4A and FIG. 4B. Illustratively, the patterning process is performed by a conventional etching process, resulting in openings 410a, 410b, 415, 410c, and 410d in the layers 120, 210, and 260, 310.

Figure 5A:
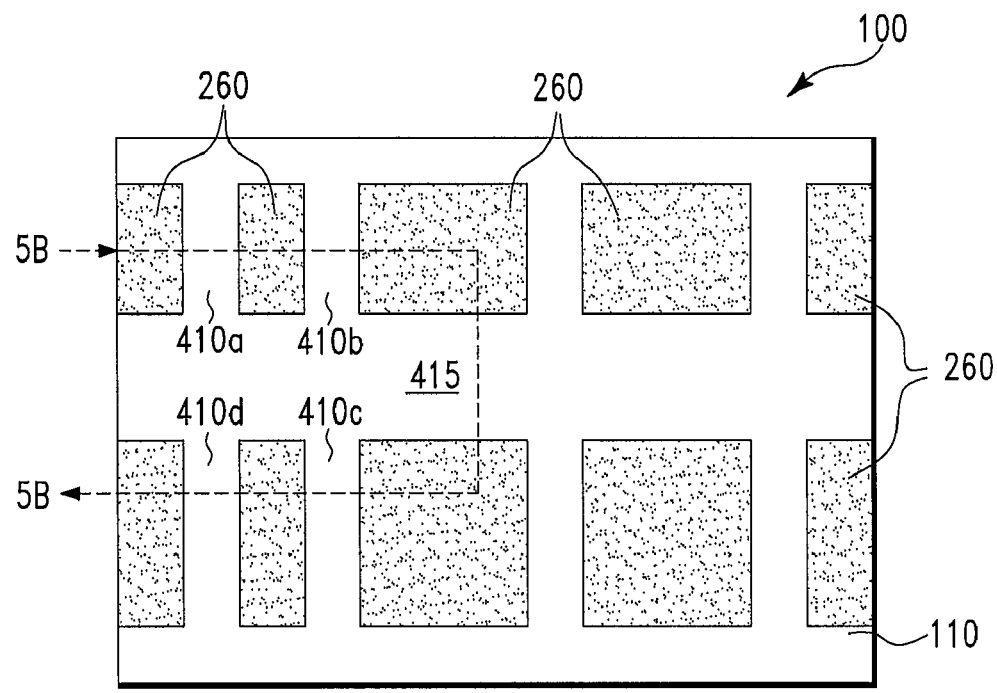
Figure 5B:
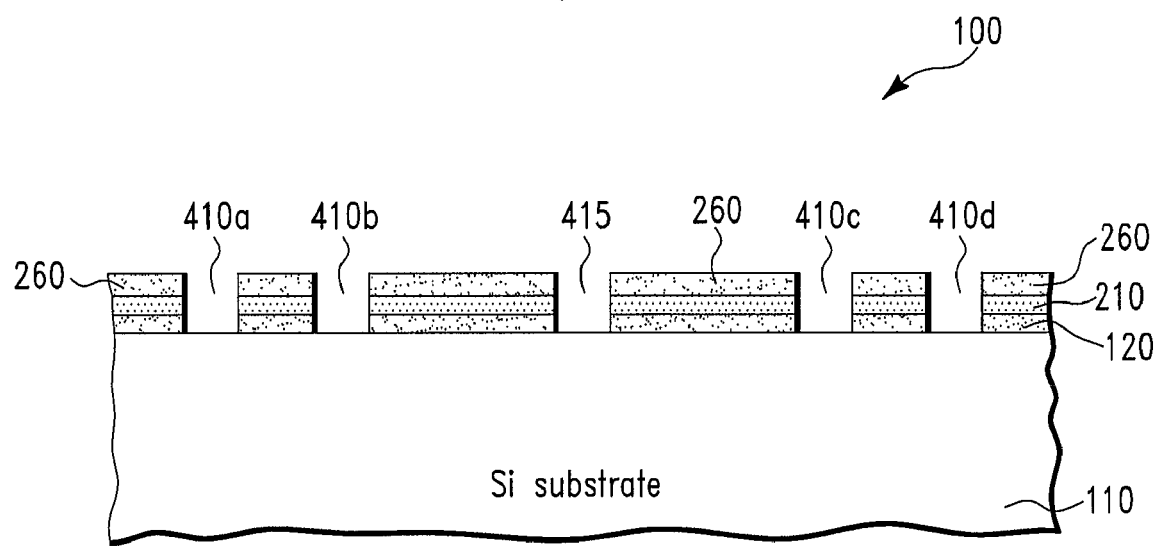

Next, in one embodiment, the first photo resist layer 310 is removed, resulting in the structure 100 of FIG. 5A and FIG. 5B (a cross section view of FIG. 5A along a line 5B-5B). Illustratively, the first photo resist layer 310 is removed using a conventional method.

Next, in one embodiment, the semiconductor substrate 110 is etched via the openings 410a, 410b, 415, 410c, and 410d. Illustratively, the semiconductor substrate 110 is etched by RIE (Reactive Ion Etching) process, resulting in shallow trenches 410a', 410b', 415', 410c', and 410d', respectively, as shown in FIG. 6A and FIG. 6B (a cross section view of FIG. 6A along a line 6B-6B).

Figure 6A:
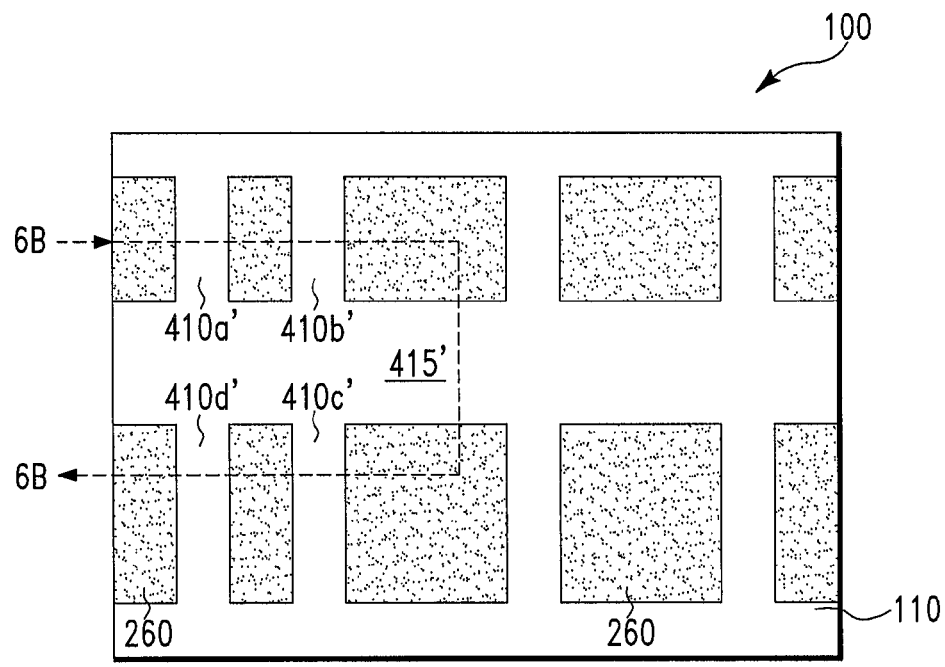
Figure 6B:
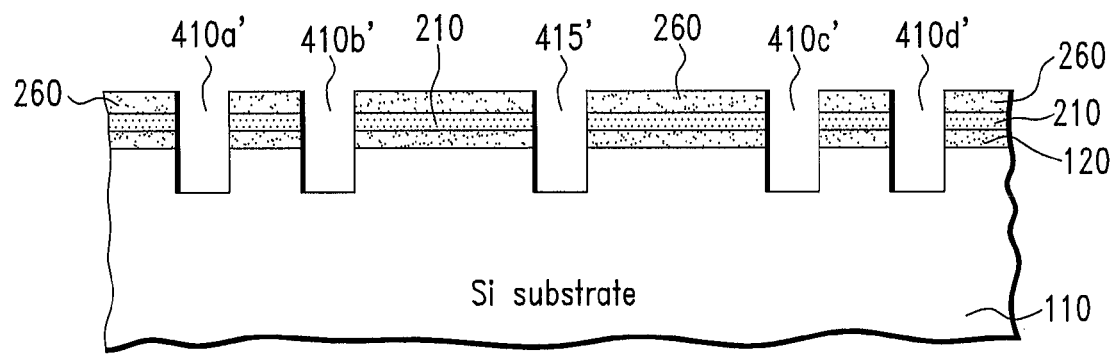
Figure 7A:
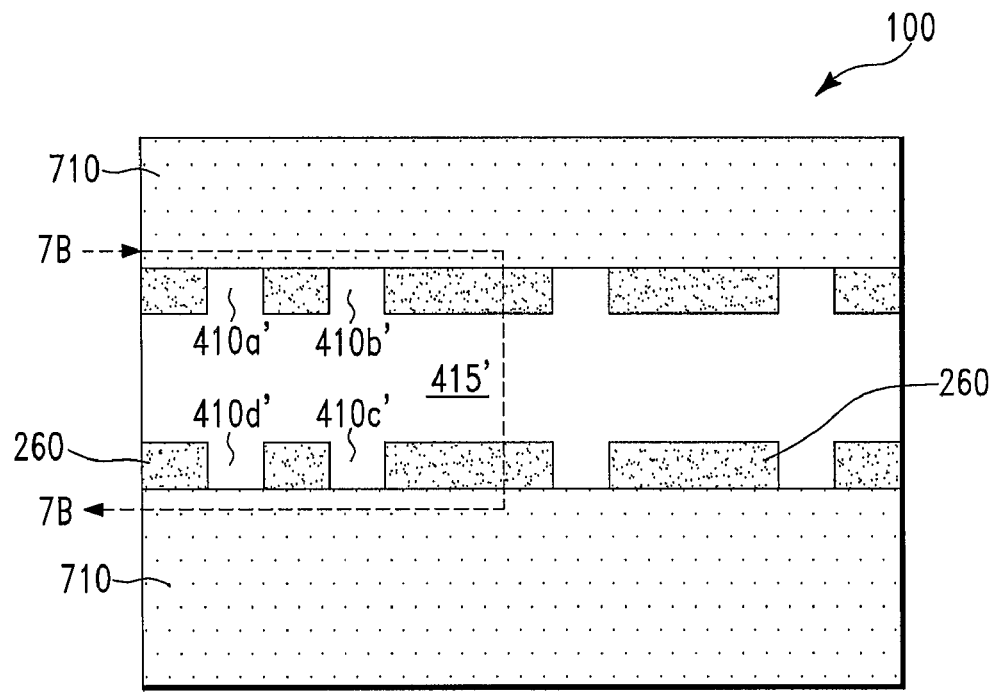
Figure 7B:
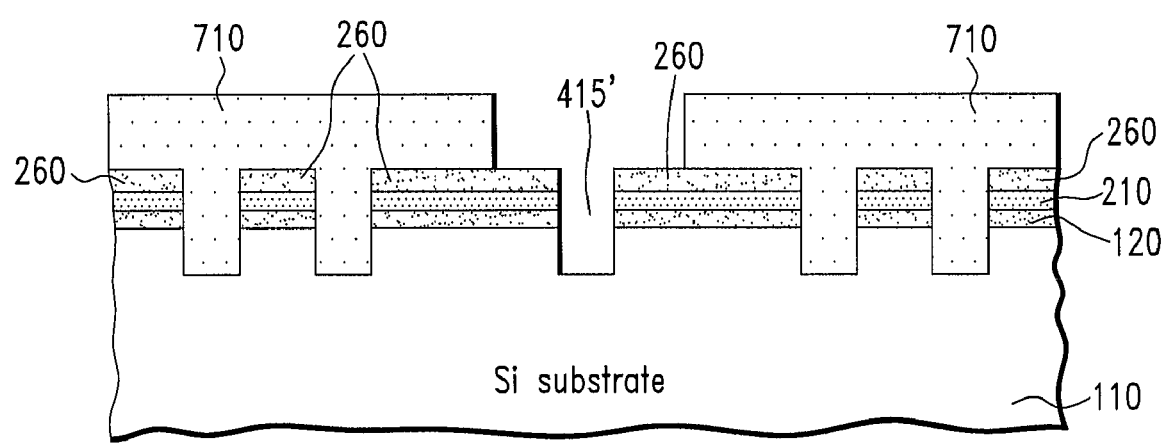

Next, with reference to FIG. 7A and FIG. 7B (a cross section view of FIG. 7A along a line 7B-7B), in one embodiment, a second patterned photo resist layer 710 is formed on top of the structure 100 of FIG. 6A. More specifically, the second patterned photo resist layer 710 is formed by using a conventional lithography process. It should be noted that portions of the trenches 410a', 410b', 410c', and 410d' and the entire trench 415' are not covered by the second patterned photo resist layer 710, as shown in FIG. 7A and FIG. 7B.

Figure 8A:
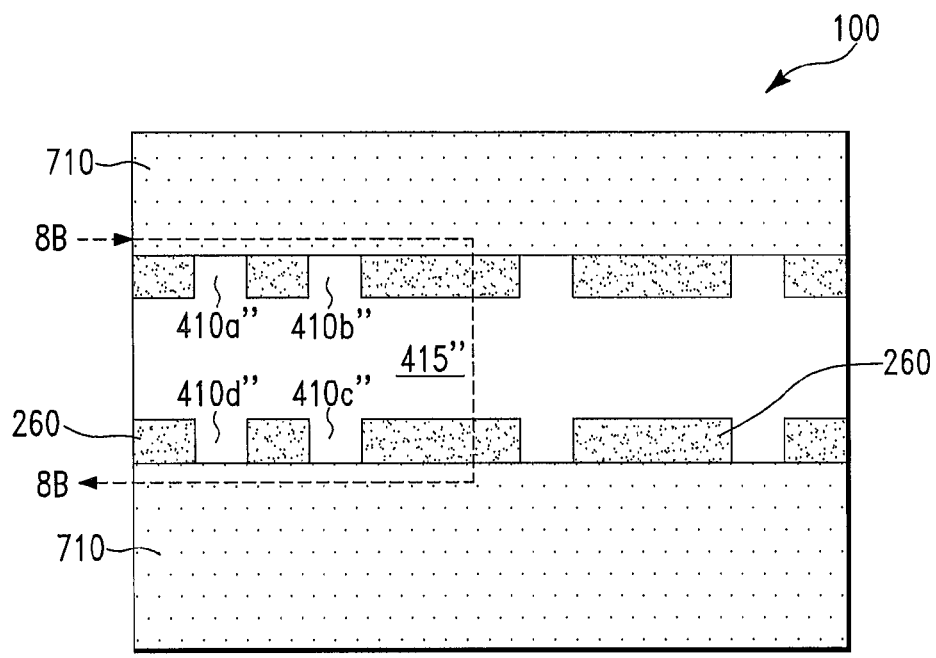
Figure 8B:
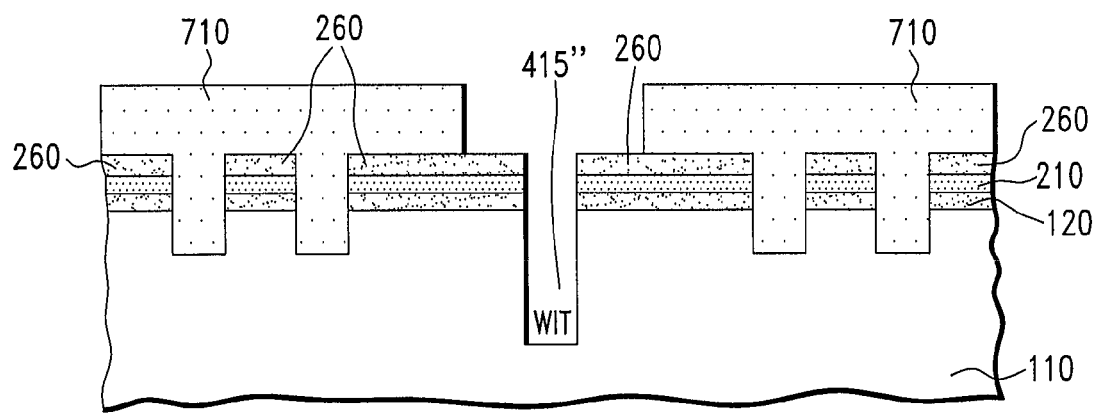

Next, with reference to FIG. 8A and FIG. 8B (a cross section view of FIG. 8A along a line 8B-8B), in one embodiment, the second patterned photo resist layer 710 and the hard mask layer 260 are used as masks for directionally etching the semiconductor substrate 110, resulting in structure 100 of FIG. 8A and FIG. 8B. In other words, sections of the trenches 410a', 410c', 410d', and 415' of FIG. 7A and FIG. 7B, which are not covered by the masks, become deeper, resulting in the trenches 410a", 410b", 410c", 410d", and a well isolation trench 415", respectively, as shown in FIG. 8A and FIG. 8B.

It should be noted that the process of forming the trench 415' (FIG. 7A, FIG. 7B) and the process of making the trench 415' deeper, resulting in the well isolation trench 415", uses the same hard mask 260. As a result, when going from top to bottom of the well isolation trench 415", an area of a horizontal cross section of the well isolation trench 415" does not changes abruptly. In other words, when going from top to bottom of the well isolation trench 415", an area of a horizontal cross section of the well isolation trench 415" is essentially a continuous function (i.e., either varies essentially continuously or remains essentially unchanged). The position and the width of the well isolation trench 415" are identical to the initial shallow trench 415'.

Figure 9A:
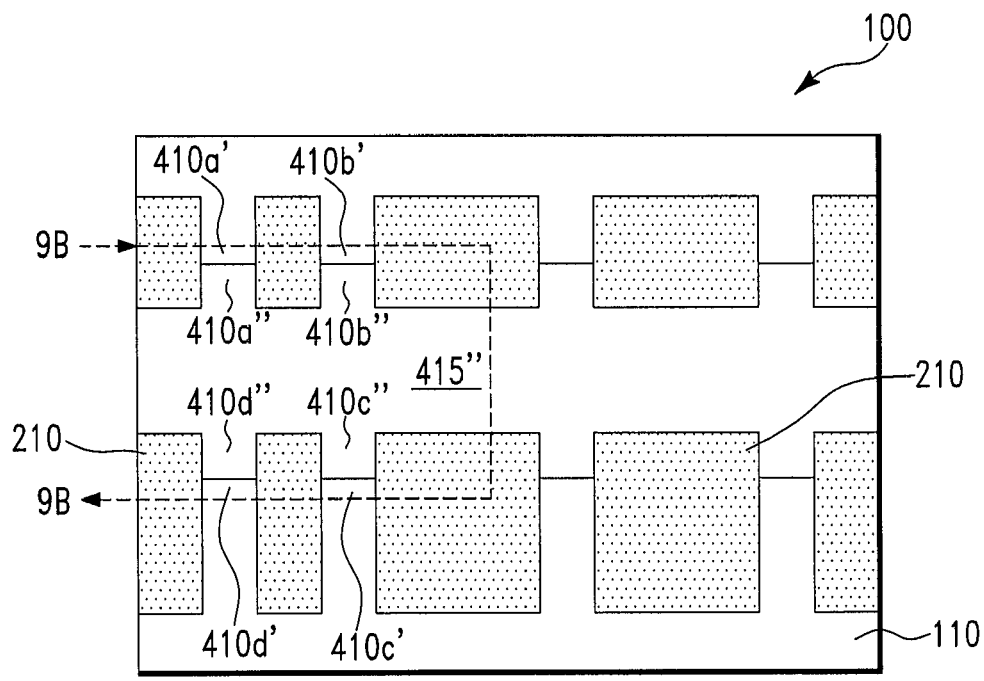
Figure 9B:
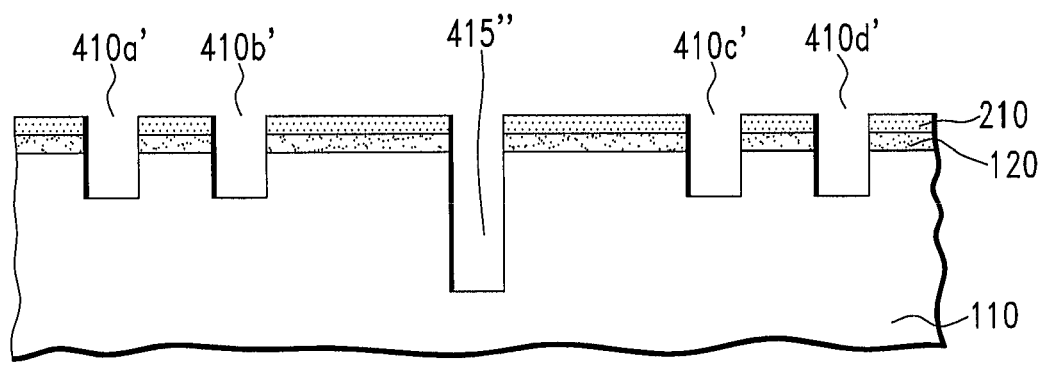

Next, with reference to FIG. 9A and FIG. 9B (a cross section view of FIG. 9A along a line 9B-9B), in one embodiment, the second patterned photo resist layer 710 (FIG. 8A and FIG. 8B) is removed by a conventional method, and then the hard mask layer 260 (FIG. 8A and FIG. 8B) is removed using wet etching.

Figure 10A:
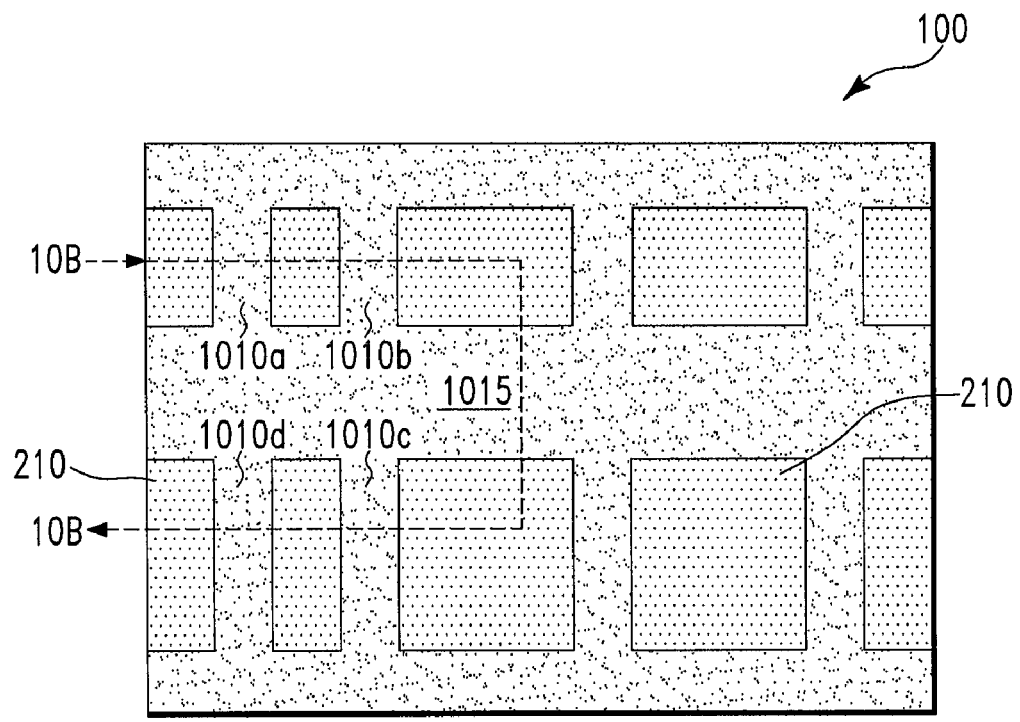
Figure 10B:
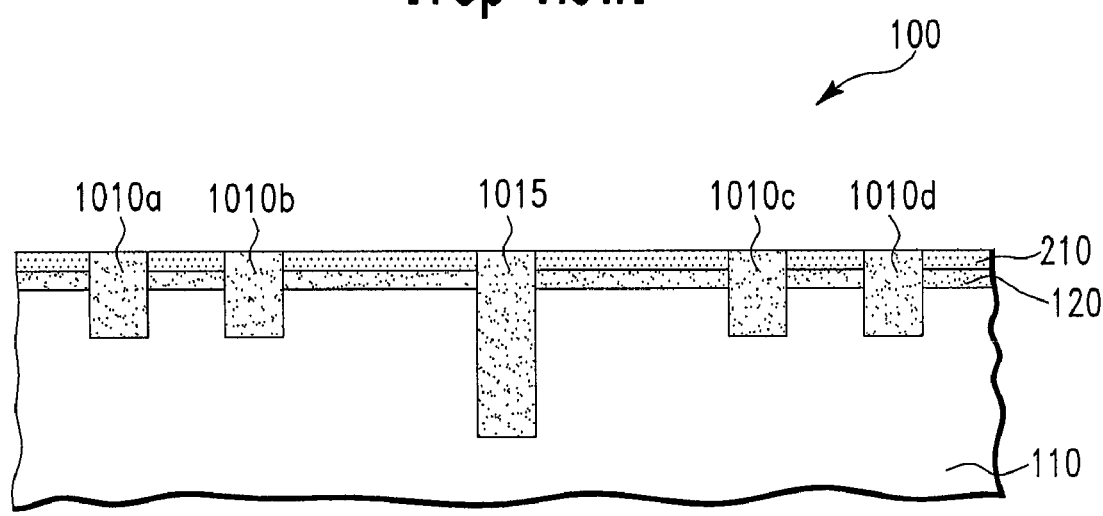
Figure 11A:
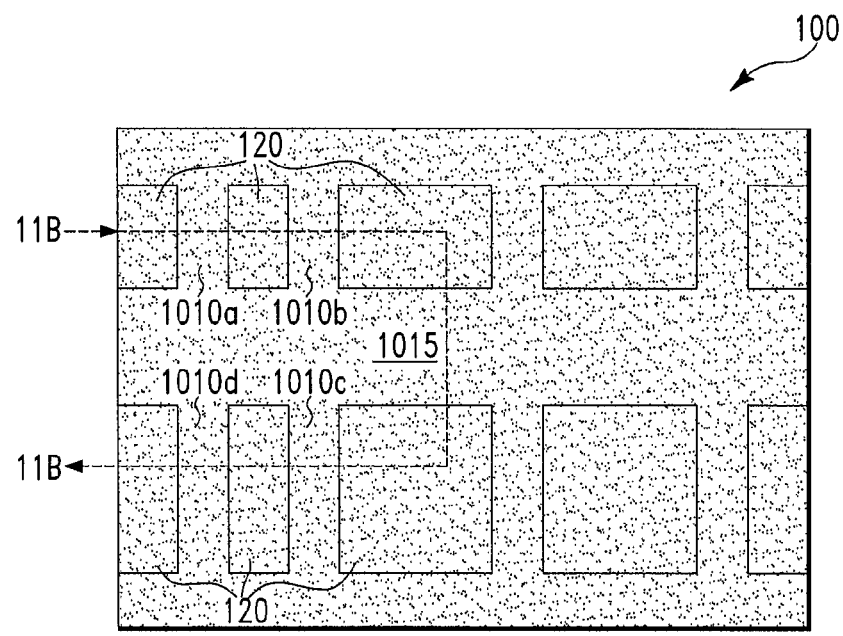
Figure 11B:
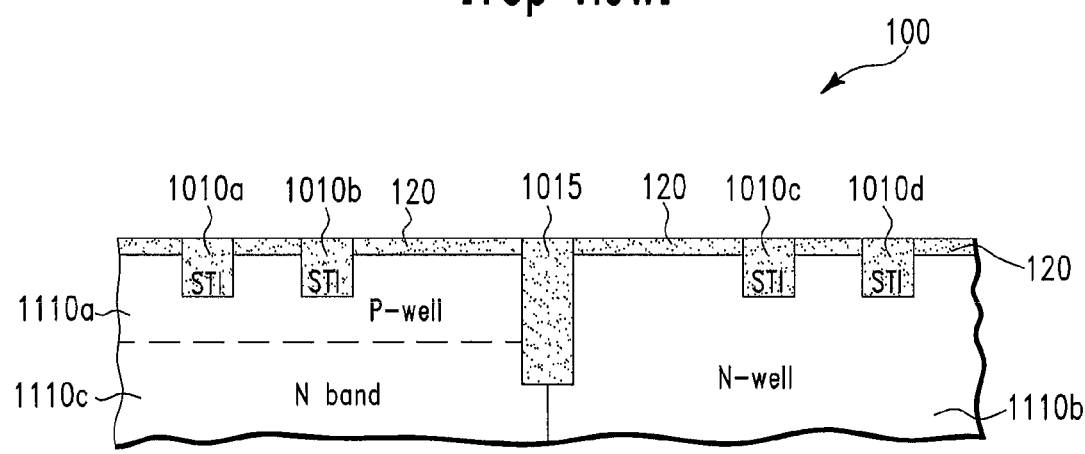

Next, with reference to FIG. 10A and FIG. 10B (a cross section view of FIG. 10A along a line 10B-10B), in one embodiment, STI (Shallow Trench Isolation) regions 1010a, 1010b, 1010c, and 1010d are formed in the trenches 410a' and 410a", 410b' and 410b", 410c' and 410c", and 410d' and 410d" and 410d", respectively, and a well isolation region 1015 is formed in the well isolation trench 415". Illustratively, the STI regions 1010a, 1010b, 1010c, 1010d and the well isolation region 1015 comprise silicon dioxide. In one embodiment, the STI regions 1010a, 1010b, 1010c, 1010d and the well isolation region 1015 are formed by (i) CVD of a silicon dioxide layer (not shown) everywhere on top of the structure 100 (including in the trenches) of FIG. 10A and then (ii) CMP (Chemical Mechanical Polishing) the deposited silicon dioxide layer until the pad nitride layer 210 is exposed to the surrounding ambient, resulting in the STI regions 1010a, 1010b, 1010c, 1010d and the well isolation region 1015, as shown in FIG. 10A and FIG. 10B. As a result, when going from top to bottom of the well isolation region 1015, an area of a horizontal cross section of the well isolation region 1015 does not change abruptly.

Next, in one embodiment, the STI regions 1010a, 1010b, 1010c, 1010d and the well isolation region 1015 are recessed to approximately the top surface of the pad oxide 120. Next, in one embodiment, the pad nitride layer 210 is removed by wet etching followed by a CMP process resulting in the structure 100 of FIG. 11A and FIG. 11B (a cross section view of FIG. 11A along a line 11B-11B). Next, with reference to FIG. 11A and FIG. 11B, in one embodiment, a P-region 1110a and an N-region 1110b are formed in the semiconductor substrate 110 to the north and south of the trench 1015, respectively. Illustratively, the P-region 1110a is formed by ion implantation with P-type dopants, and the N-region 1110b is formed by ion implantation with N type dopants, resulting in structure 100 of FIG. 11A and FIG. 11B. Hereafter, the P-region 1110a is referred to as a P-well region 1110a and the N-region 1110b is referred to as an N-well region 1110b. In one embodiment, an N-band 1110c is also formed by ion implantation under the P-well. The N-band is connected to the N-well.

Figure 12A:
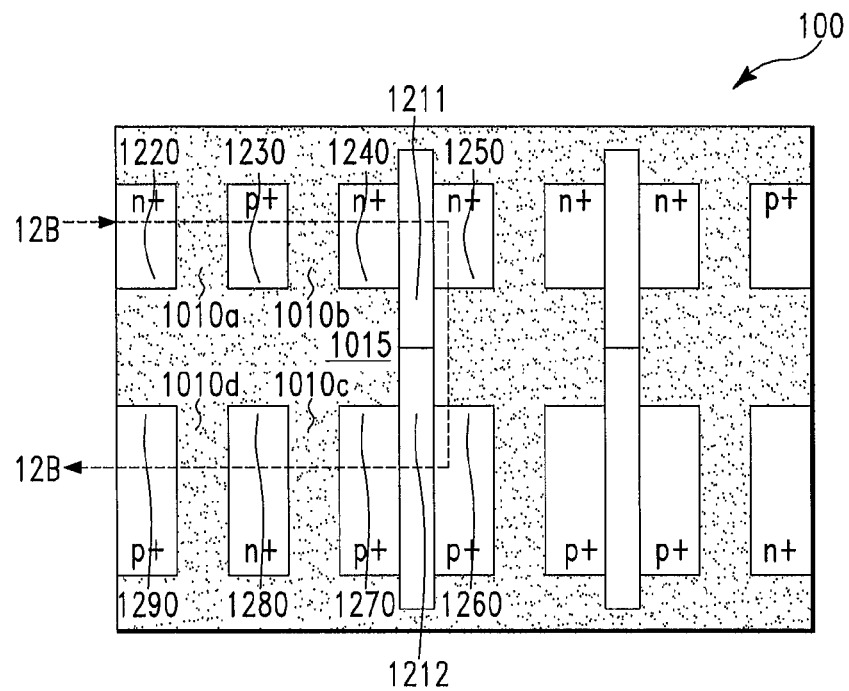
Figure 12B:
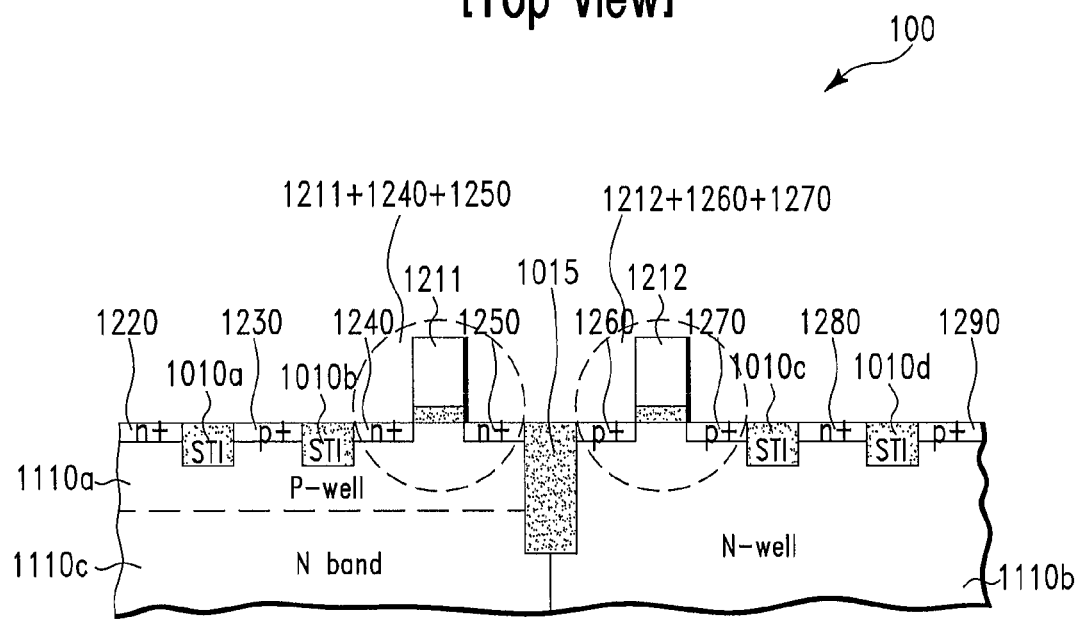

Next, with reference to FIG. 12A and FIG. 12B (a cross section view of FIG. 12A along a line 12B-12B), in one embodiment, doped regions 1220, 1230, 1240, 1250, 1260, 1270, 1280, and 1290 and gate stacks 1211 and 1212 are formed in the semiconductor substrate 110. In one embodiment, the gate stacks 1211 and 1212 are formed by a conventional method. In one embodiment, the doped regions 1220, 1230, 1240, 1250, 1260, 1270, 1280, and 1290 are formed by ion implantation. Illustratively, the doped regions 1220, 1240, 1250, and 1280 are doped with N type dopants, and the doped regions 1230, 1260, 1270, and 1290 are doped with P type dopants. In one embodiment, the gate stack 1211 and the doped regions 1240 and 1250 form an N-channel transistor 1211+1240+1250; whereas the gate stack 1212 and the doped regions 1260 and 1270 form a P-channel transistor 1212+1260+1270. In one embodiment, the N-channel transistor 1211+1240+1250 and the P-channel transistor 1212+1260+1270 are connected so as to form a CMOS device. The doped regions 1280 and 1230 are for the N-well and the P-well contacts, respectively.

As can be seen in FIG. 12A and FIG. 12B, the N-channel transistor 1211+1240+1250 is formed on top of the P-well region 1110a, and the P-channel transistor 1212+1260+1270 is formed on top of the N-well region 1110b. These two transistors are separated by the well isolation region 1015 (which is formed in the well isolation trench 415" of FIG. 9A and FIG. 9B) wherein the well isolation region 1015 is deeper than the STI regions 1010a, 1010b, 1010c, 1010d. Therefore, the CMOS device has better device properties.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A semiconductor structure, comprising:
  (a) a semiconductor substrate;
  (b) a P well, an N well, and an N band region in the semiconductor substrate,
    wherein the P well comprises a first shallow trench isolation (STI) region and a first doped region, and
    wherein the N well comprises a second STI region and a second doped region; and
  (c) a well isolation region sandwiched between and only in direct physical contact with the P well, the N well, the first doped region, the second doped region, and the N band region,
    wherein a the horizontal bottom surface of the well isolation region is at a lower level than bottom surfaces of the first and second STI regions,
    wherein the horizontal bottom surface of the well isolation region is only in contact with the N band region and the N well;
    wherein when going from top to bottom of the well isolation region, an area of a horizontal cross section of the well isolation region is an essentially continuous function,
    wherein said well isolation region comprises vertical side surfaces formed entirely perpendicular to a horizontal top surface of said well isolation region and said horizontal bottom surface, and
    wherein each vertical side surface of said vertical side surfaces consists of a single planer surface.

2. The semiconductor structure of claim 1, wherein the first and second STI regions comprise silicon dioxide.

3. The semiconductor structure of claim 1, wherein a top surface of the well isolation region is essentially coplanar with top surfaces of the first and second STI regions.

4. The semiconductor structure of claim 1, further comprising
an N channel transistor on the P well; and
a P channel transistor on the N well.

5. The semiconductor structure of claim 4, wherein the N channel transistor and the P channel transistor are connected so as to form a CMOS device.

6. The semiconductor structure of claim 1, wherein the N band is formed directly beneath the P well and in direct physical contact with the N well.

7. The semiconductor structure of claim 1, wherein said well isolation region consists of a single uniform width.

8. The semiconductor structure of claim 1, wherein each said vertical side surface does not comprise a slope.

9. The semiconductor structure of claim 1, wherein the first STI region only extends through a top surface and into a portion of the P well, and wherein the second STI region only extends through a top surface and into a portion of the N well.

10. The semiconductor structure of claim 1, wherein the P well further comprises a third doped region, a fourth doped region, a fifth doped region, and a third STI region, wherein the N well comprises a sixth doped region, a seventh doped region, an eighth doped region, and a fourth STI region, wherein the first STI region separates the third doped region from the fourth doped region, wherein the third STI region separates the fourth doped region from the fifth doped region, wherein the second STI region separates the sixth doped region from the seventh doped region, wherein the fourth STI region separates the seventh doped region from the eighth doped region, wherein the first doped region, the third doped region, the fifth doped region, and the seventh doped region each comprise N type dopants, and wherein the second doped region, the fourth doped region, the sixth doped region, and the eighth doped region each comprise P type dopants.

11. The semiconductor structure of claim 1, wherein the N band region extends below a non-entire portion of the horizontal bottom surface of the well isolation region.

12. The semiconductor structure of claim 1, wherein the N well region extends below a non-entire portion of the horizontal bottom surface of the well isolation region.

* * * * *